(12) United States Patent
Lemke et al.

(10) Patent No.: US 6,482,050 B1
(45) Date of Patent: Nov. 19, 2002

(54) CONTACT FOR ELECTRICAL COMPONENT SOCKET

(75) Inventors: Timothy A. Lemke, Dillsburg; Timothy W. Houtz, Etters; Stanley W. Olson, East Berlin; Lewis R. Johnson, Liverpool, all of PA (US)

(73) Assignee: FCI Americas Technology, Inc., Reno, NV (US)

( * ) Notice: Subject to any disclaimer, the term of this patent is extended or adjusted under 35 U.S.C. 154(b) by 245 days.

(21) Appl. No.: 09/675,218

(22) Filed: Sep. 29, 2000

Related U.S. Application Data

(60) Division of application No. 09/216,574, filed on Dec. 18, 1998, now Pat. No. 6,155,860, which is a continuation-in-part of application No. 09/209,132, filed on Dec. 10, 1998, now Pat. No. 6,093,042.
(60) Provisional application No. 60/073,281, filed on Jan. 31, 1998.

(51) Int. Cl.[7] .............................................. H01R 11/22
(52) U.S. Cl. .......................... 439/856; 439/83; 439/857
(58) Field of Search ................................ 439/856, 857, 439/83, 876

(56) References Cited

U.S. PATENT DOCUMENTS

| | | | |
|---|---|---|---|
| 2,779,011 A | * | 1/1957 | Deakin ........................ 439/857 |
| 3,133,775 A | | 5/1964 | Plaxa |
| 3,865,462 A | | 2/1975 | Cobaugh et al. |
| 4,175,821 A | | 11/1979 | Hunter |
| 4,257,665 A | | 3/1981 | John et al. |
| 4,396,140 A | | 8/1983 | Jaffe et al. |
| 4,503,608 A | | 3/1985 | Evans |
| 4,591,230 A | | 5/1986 | Roldan |
| 4,761,140 A | | 8/1988 | Geib |
| 4,836,798 A | | 6/1989 | Carter |
| 4,869,681 A | | 9/1989 | Vache et al. |
| 4,887,976 A | | 12/1989 | Bennett et al. |
| 4,941,840 A | | 7/1990 | Okada |
| 5,000,689 A | | 3/1991 | Ishizuka et al. |
| 5,057,031 A | | 10/1991 | Sinclair |
| 5,123,855 A | | 6/1992 | Petersen |
| 5,147,213 A | | 9/1992 | Funk et al. |
| 5,215,472 A | | 6/1993 | DelPrete et al. |
| 5,268,820 A | | 12/1993 | Tseng |
| 5,302,136 A | | 4/1994 | Germain et al. |
| 5,378,169 A | | 1/1995 | Volz et al. |
| 5,399,108 A | | 3/1995 | Lu et al. |
| 5,531,605 A | | 7/1996 | Taniuchi et al. |
| 5,602,719 A | | 2/1997 | Kinion |
| 5,649,836 A | | 7/1997 | Kashiwagi |
| 5,762,511 A | | 6/1998 | Scheitz et al. |
| 5,876,219 A | | 3/1999 | Taylor et al. |
| 5,966,023 A | | 10/1999 | Burgers et al. |
| 6,004,142 A | | 12/1999 | Wark |

FOREIGN PATENT DOCUMENTS

| | | | |
|---|---|---|---|
| EP | 0 806 813 A2 | 11/1997 | |
| FR | 2305040 | * 10/1976 | ................. 439/856 |
| WO | 98/15989 | 10/1997 | |

* cited by examiner

*Primary Examiner*—Tho D. Ta
(74) *Attorney, Agent, or Firm*—Steven M. Reiss; M. Richard Page

(57) ABSTRACT

A contact having a retention portion, a tail portion and a pair of beams. The beams each have a first portion which displaces the beam from opposite sides of the plane of the retention portion and a second portion extending from, and canted relative to, the first portion. The second portions interact to receive a mating contact therebetween.

19 Claims, 11 Drawing Sheets

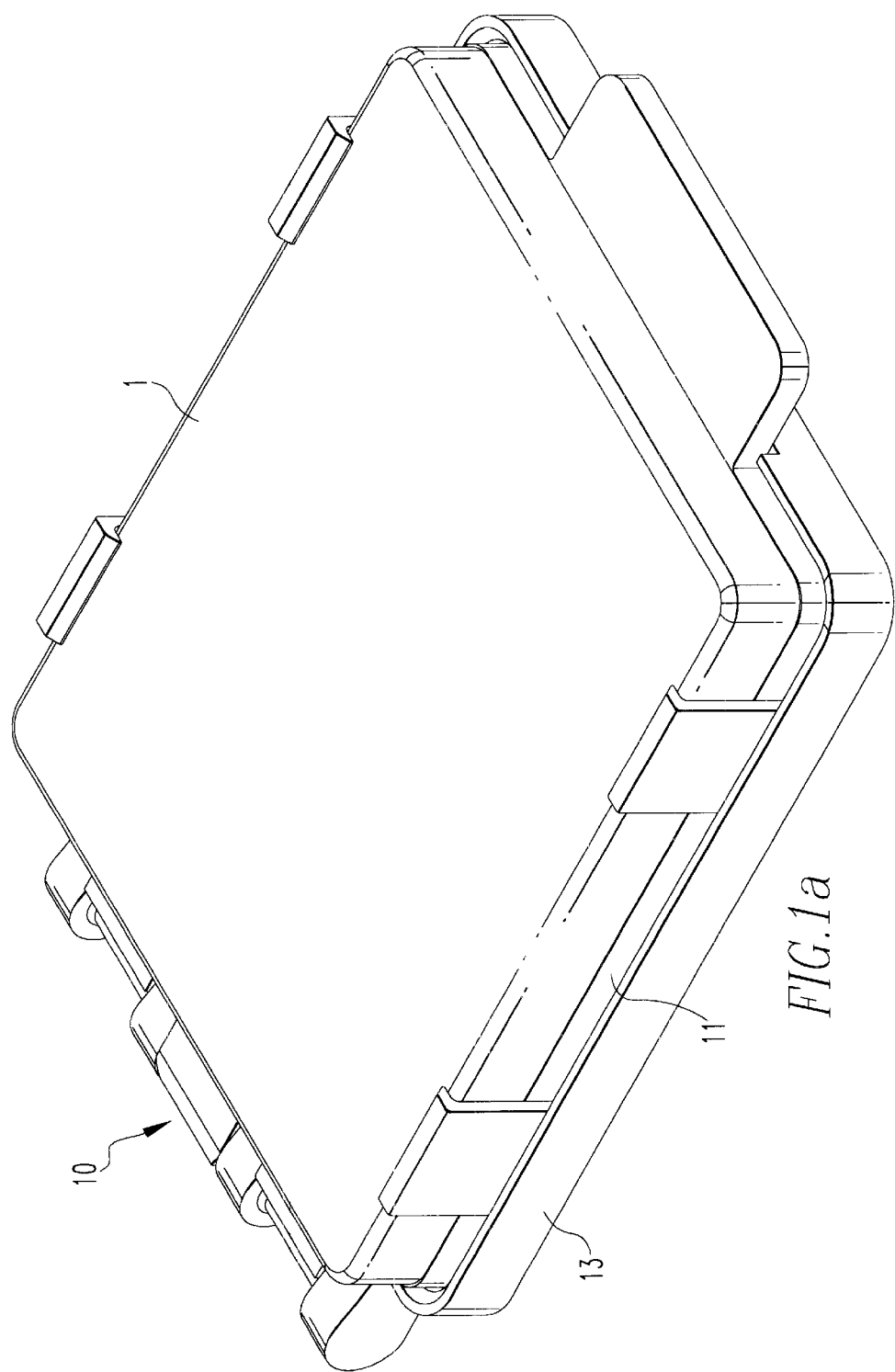

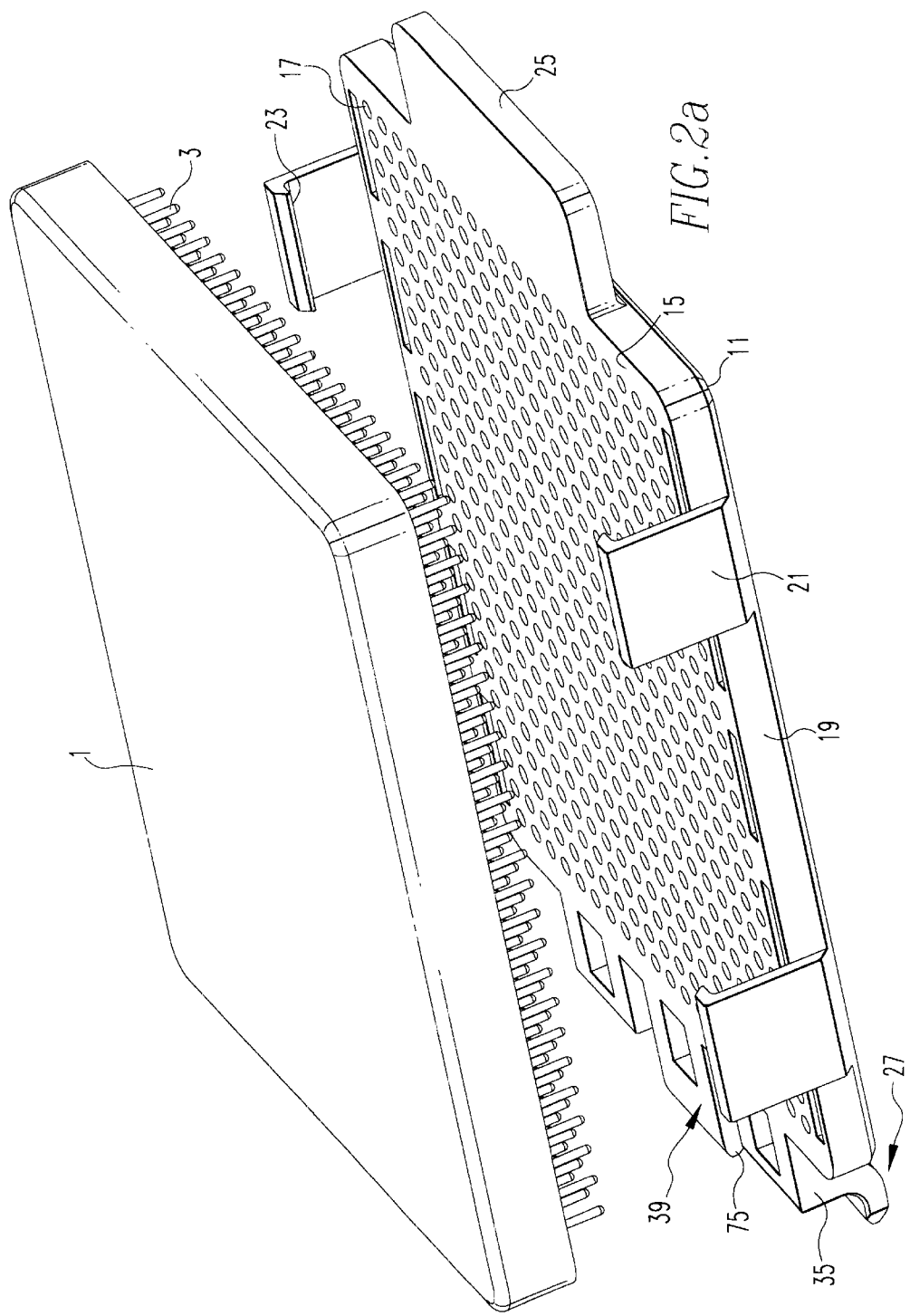

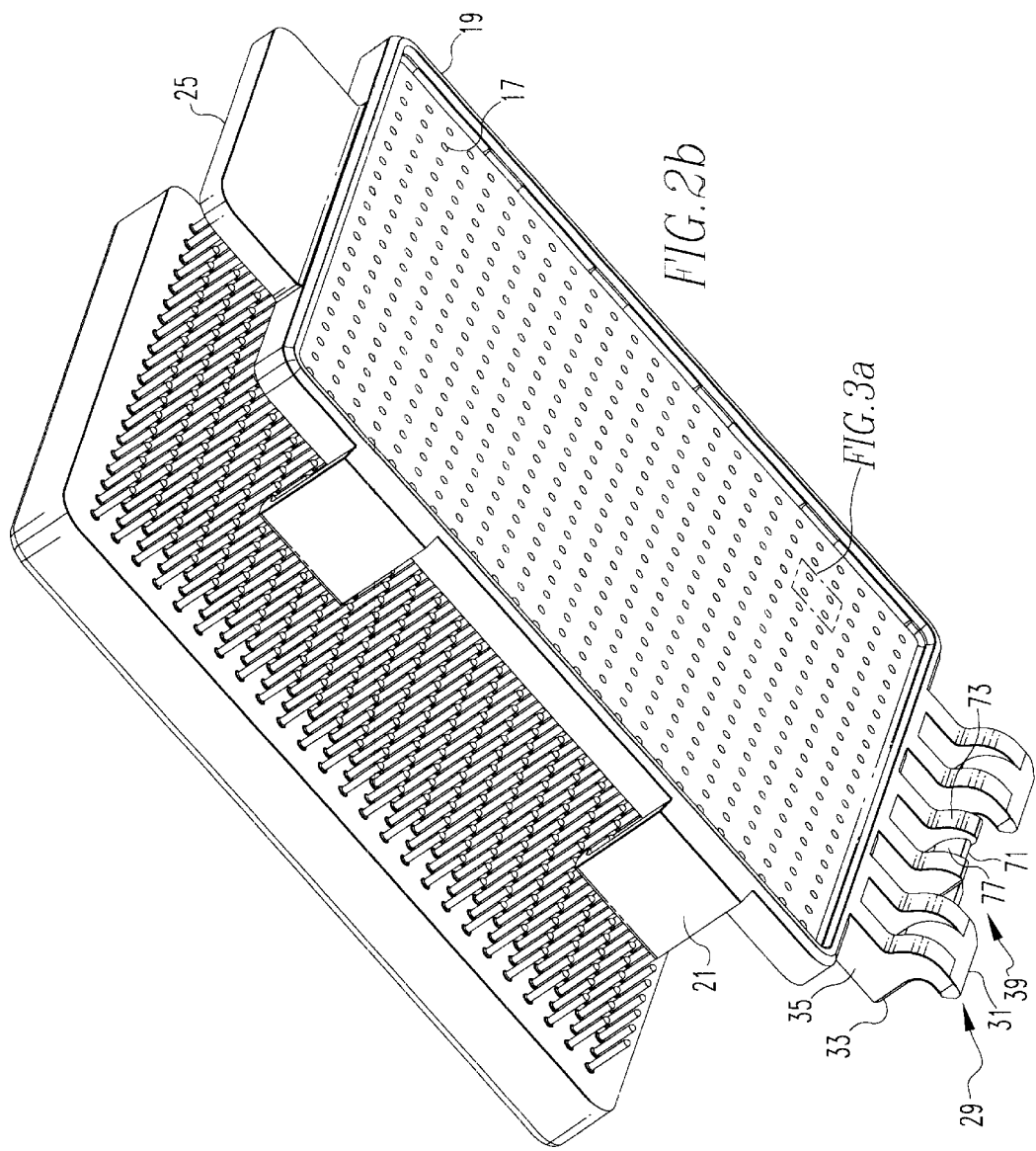

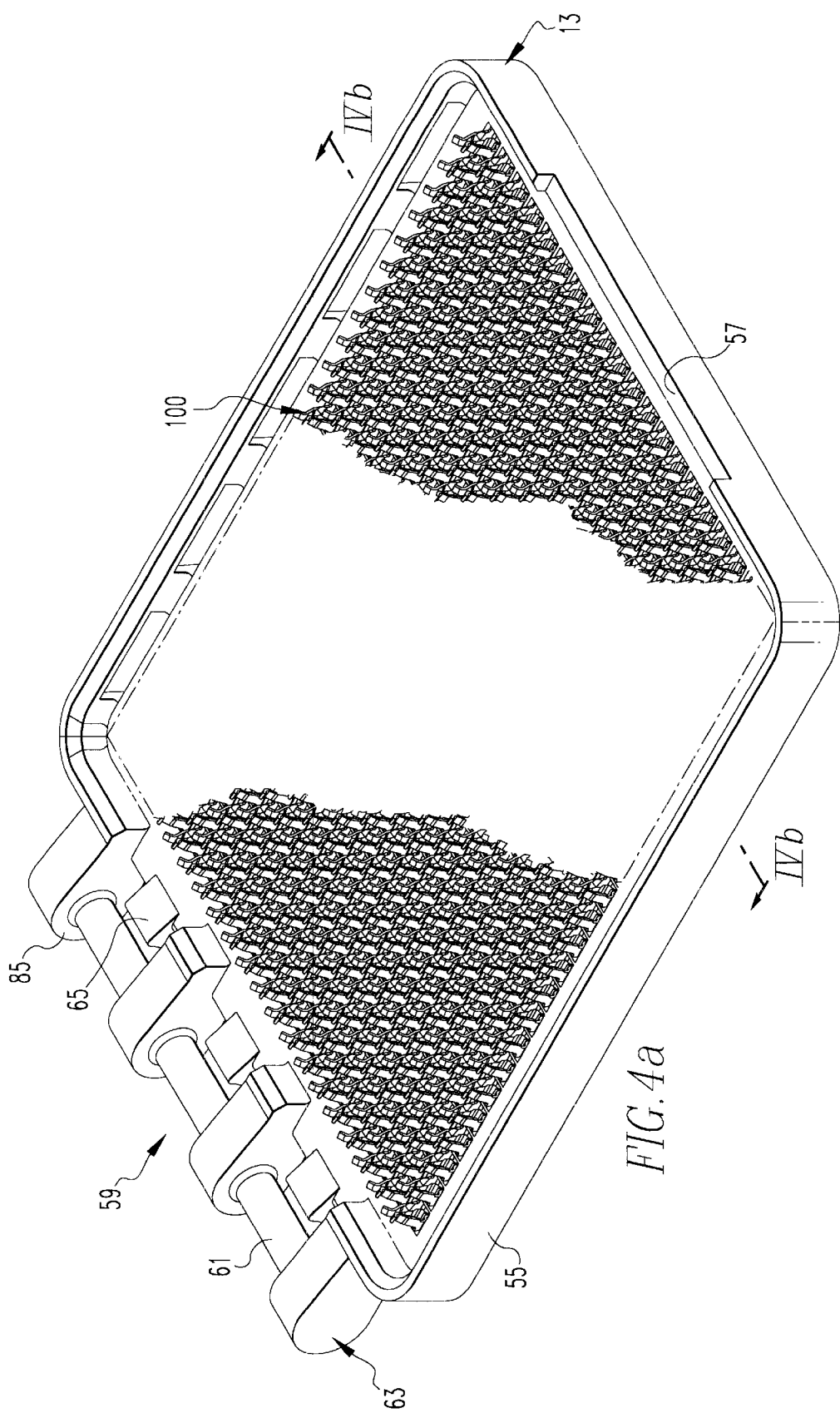

CONTACT FOR ELECTRICAL COMPONENT SOCKET

CROSS-REREFENCE TO RELATED APPLICATIONS

This application is a divisional of Application Ser. No. 09/216,574, filed on Dec. 18, 1998 and now U.S. Pat. No. 6,155,860, which is a continuation-in-part of U.S. patent application Ser. No. 09/209,132, filed on Dec. 10, 1998 and now U.S. Pat. No. 6,093,042, and which claims the benefit of Provisional Application No. 60/073,281, filed on Jan. 31, 1998, each herein incorporated by reference.

BACKGROUND OF THE INVENTION

1. Field of the Invention

The present invention relates to electrical connectors. More specifically, the present invention relates to a contact for an electrical component socket.

2. Brief Description of Earlier Developments

Electrical components, such as integrated circuit (IC) chips, must be secured to a substrate. One example of an interconnection system for securing such pin grid array (PGA) components to a substrate is a zero insertion force (ZIF) system. In ZIF systems, pins of the PGA component enter an interconnect housing without engaging contacts of the interconnect mounted to the substrate. Only after the PGA component seats on the interconnect housing are the contacts and pins engaged.

One method of engaging the contacts and PGA pins involves moving the PGA pins laterally and into engagement with the contacts. An actuating lever and a cam surface drive an interposer assembly laterally to propel the PGA pins. The interposer assembly moves the PGA pins towards, and into connection with, the contacts.

The housing used with such ZIF interconnects encounters loading during, and after, lever actuation. The forces required to deflect the contacts in order to receive the PGA pins determines the amount of loading on the housing. The greater number of contacts increases the peak, or maximum force required to mate the contacts and PGA pins. It is estimated that an interconnect with 500 contacts requires approximately twenty (20) pounds of force to mate the contacts and PGA pins successfully.

Technological advances have increased the pin count and contact density of PGA components and have miniaturized computer components (requiring reduced profile sizes). While the improved speed may satisfy consumers, these technological advances burden conventional ZIF sockets. Often, a design that compensates for one of the above technological advances is mutually exclusive to a design that compensates for another technological advance.

In one example of a modification, a designer may increase the number of holes in the socket and decrease the pitch between the holes to account for increased pin density and the pin count. However, this reduces the strength of the socket.

In another example of a modification, a designer may shorten the contact to account for reduced profile size. A shorter contact exhibits greater stiffness, thus increasing the required insertion force to mate with the PGA pins.

These two design objectives impose conflicting requirements, since a stiffer contact requires more actuation force on the lever. A larger actuation force increases the loading on the socket. But the reduced strength of the socket (due to the increased hole count and decreases pitch) renders the socket less likely to withstand the increased loading.

The increased contact density has also taxed the capabilities of conventional contact forming methods. The typical method of forming opposed dual beam contacts is to stamp the contact from a sheet of material. However, the width of the sheet material required to form a single contact with conventional techniques will exceed the pitch requirements imposed by these technological advances.

SUMMARY OF THE INVENTION

It is an object of the present invention to provide an improved device for connecting an electrical component to a substrate.

It is a further object of the present invention to provide a socket for an electrical component that exhibits lower peak insertion force.

It is a further object of the present invention to provide a socket for an electrical component that selectively mates only a portion of the contacts at a time.

It is a further object of the present invention to provide a device for connecting an electrical component to a substrate that sequentially mates contacts in columns.

It is a further object of the present invention to provide a socket for an electrical component that accommodates larger pin counts.

It is a further object of the present invention to provide a device for connecting an electrical component to a substrate that precisely aligns the mating contacts during rotation.

It is a further object of the present invention to provide a contact with in-line dual beams.

These and other objects of the present invention are achieved in one aspect by a contact. The contact has a retention portion, a tail portion and a pair of beams. The retention portion has opposed ends and defines a plane. The tail portion extends from one end of the retention portion. The pair of beams extend from the other end of the retention portion. Each of said pair of beams has a first portion and a second portion. The first portion displaces the beam from the plane of the retention portion, with each beam located on opposite sides of the plane of the retention portion. The second portion extends from, and is canted relative to, the first portion. The second portion has a contact interacting portion. The contact interacting portions of both beams interact to receive a contact therebetween.

These and other objects of the present invention are achieved in another aspect by a method of making a contact. The contact has a retention portion for engaging a connector housing, a tail portion extending from one of the ends, and a pair of beams extending from the other end. The retention portion has opposed ends and defines a plane. The method includes the steps of: displacing a first portion of the beams from the plane of the retention portion so that the pair of beams are located on opposite sides of the plane; and canting a second portion of the beams relative to said first portion to provide a contact interacting portion adapted to receive a mating contact therebetween.

These and other objects of the present invention are achieved in another aspect by a dual beam contact. Each beam has a proximal end and a distal end for engaging a male-type contact. The proximal ends are generally coplanar and the distal ends are aligned so as to receive the male-type contact therebetween.

BRIEF DESCRIPTION OF THE DRAWINGS

Other uses and advantages of the present invention will become apparent to those skilled in the art upon reference to the specification and the drawings, in which:

FIG. 1a is a perspective view of one embodiment of a connector of the present invention in a mated condition;

FIG. 2a is a perspective view of a portion of the connector shown in FIGS. 1a and 1b, but prior to receiving an electrical component;

FIG. 2b is another perspective view of the portion of the connector shown in FIG. 2a;

FIG. 3c is an alternative arrangement of the portion of the connector shown in FIG. 3a;

FIG. 4a is a perspective view of another portion of the connector shown in FIG.s 1a and 1b;

DETAILED DESCRIPTION OF THE PREFERRED EMBODIMENTS

FIGS. 1a, 1b, 2a, 2b, 3a, 3b, 4a–c and 5 display a first alternative embodiment of the present invention. The present invention is an electrical connector 10 that secures an electrical component 1 to a substrate S (see FIG. 5). As seen in FIG. 2a, electrical component 1 can be a PGA component such as in IC chip, however other types of electrical components could be used, such as a multi-chip module (MCM). Component 1 has a plurality of conductive elements, such as pins 3 extending therefrom. Pins 3 are arranged in an array of columns and rows. Although the conductive elements are shown as being round pins, other types of conductive elements, including blades (not shown), could be used.

Figure 1B:
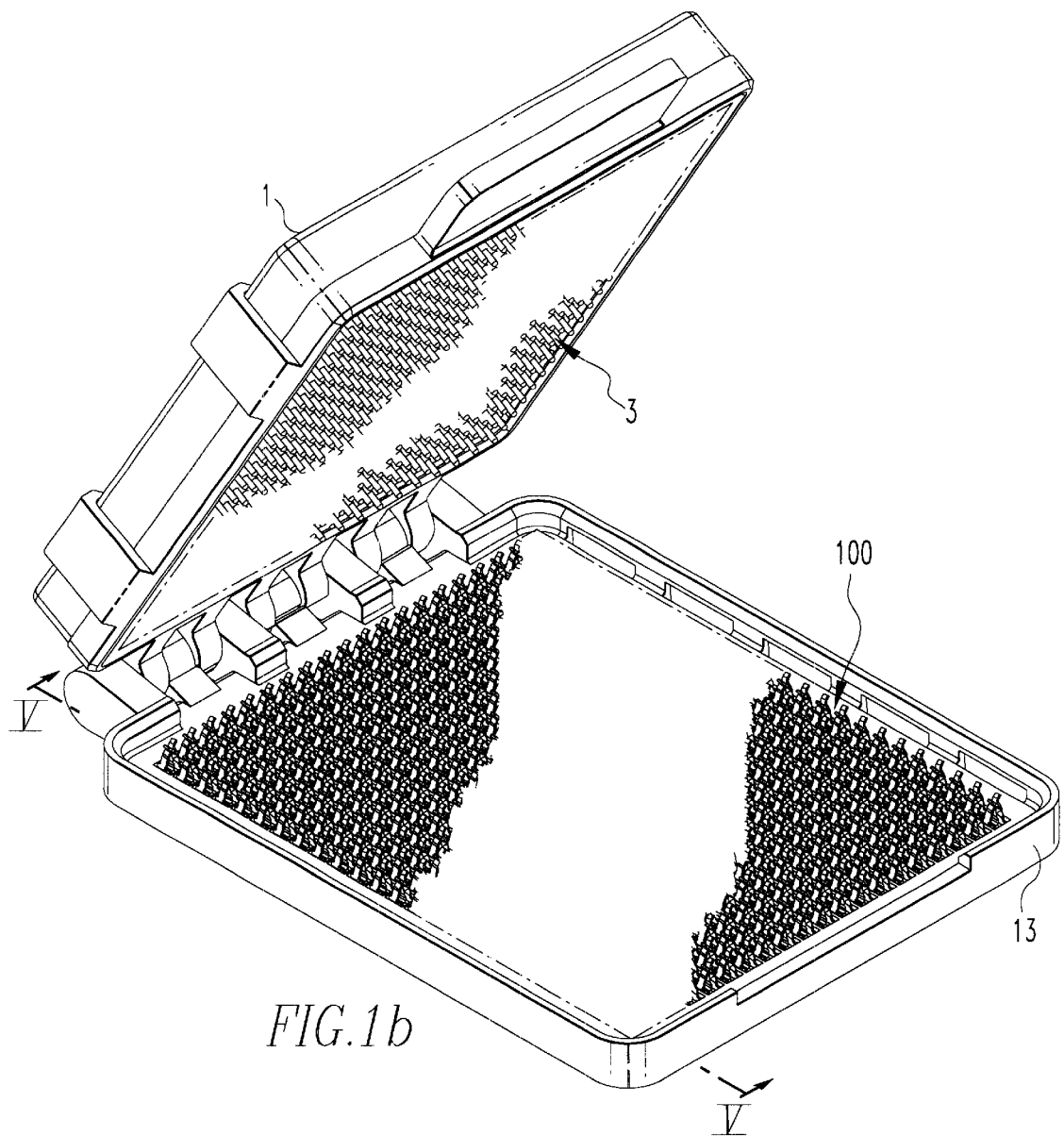
FIG. 1b is the connector shown in FIG. 1a, but in an unmated condition.

Connector 10 has two mateable pieces, a cassette 11 and a housing 13. FIG. 1a displays cassette 11 and housing 13 in a mated condition, while FIG. 1b displays an unmated condition. Cassette 11 and housing 13 will now be individually described.

FIGS. 2a and 2b display cassette 11, preferably manufactured from a suitable plastic, such as a liquid crystal polymer (LCP). Cassette 11 can have a base 15, described throughout as a plate, that receives component 1. However, other arrangements are possible to accommodate different types of electrical components 1.

At least one aperture 17 extends through base 15. In the embodiment shown in FIGS. 2a and 2b, base 15 has a plurality of apertures 17. Apertures 17 are arranged on base plate 15 so as to receive corresponding pins 3 of electrical component 1. Thus, the arrangement of apertures 17 on base 15 is determined by the location of pins 3 on electrical component 1.

Figure 3A:
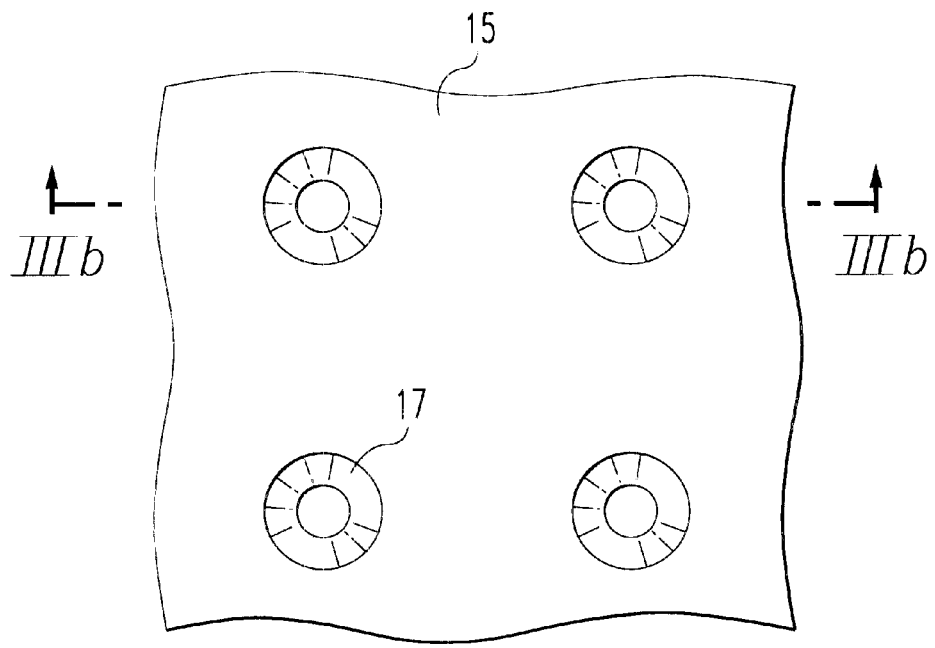
FIG. 3a is an enlarged view of the portion of the connector appearing within the dashed lines in FIG. 2b.
Figure 3B:
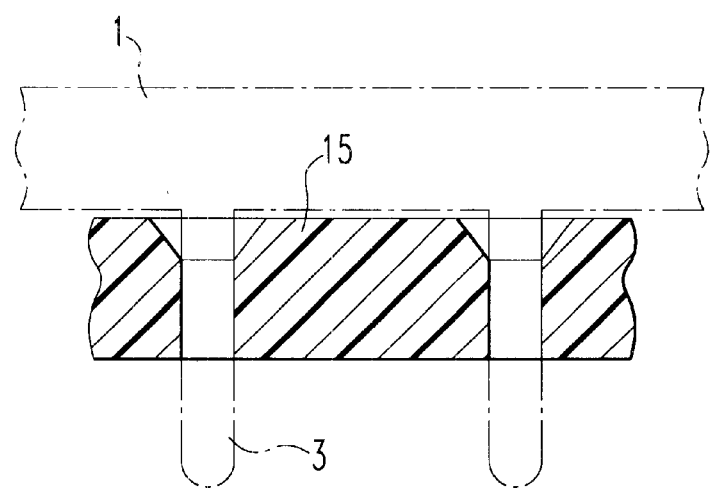
FIG. 3b is a cross-sectional view of the portion of the connector shown in FIG. 3a taken along line IIIB—IIIB.

As seen in FIGS. 3a and 3b, apertures 17 could have beveled lead-ins to assist in the insertion of pins 3. With electrical component 1 properly positioned on cassette 11, pins 3 extend past the lower surface of base plate 15 as seen in FIG. 1b.

Base plate 15 could include a wall 19 along its outer perimeter. As seen in the embodiment of FIG. 2b, wall 19 extends below the lower surface of base plate 15, for example, to protect pins 3 from damage.

Latches 21 extend from base plate 15, preferably along the sides. Latches 21 include a flange portion (see FIG. 2a) projecting generally perpendicular from base plate 15. The distal ends of the flange portions include a retaining portion 23 extending from the flange portion. The area between retaining portion 23 and the upper surface of base plate 15 receives electrical component 1.

As pins 3 of electrical component 1 enter apertures 17, electrical component 1 deflects resilient latches 21 outwardly. When electrical component 1 is fully seated on cassette 11, retaining portions 23 return to their original, non-deflected position to engage the upper surface of electrical component 1 as seen in FIG. 1b. Retaining portions 23 prevent electrical component 1 from inadvertently dislodging from cassette 11. Electrical component 1 may be removed from cassette 11 by disengaging retaining portions 23 from the upper surface of electrical component 1.

When properly seated within cassette 11, electrical component 1 can be mated with contacts 100. Cassette 11 moves relative to housing 13 so that only a limited number of pins 3 mate with contacts 100 at one time. Preferably, cassette 11 rotates relative to housing 13 so that consecutive columns of pins 3 mate with consecutive columns of contacts 100. Wall 19 includes a tab 25 on a leading edge of base plate 15 to assist the installer in rotating cassette 11. The mating of pins 3 with contacts 100 will be described in greater detail below.

Wall 19 also includes a hinge assembly 27 at a trailing edge of base plate 15. Hinge assembly 27, in conjunction with the hinge assembly on housing 13, allows rotation of cassette 11 relative to housing 13 and ensures the proper alignment of pins 3 of electrical component 1 with contacts 100 of housing 13 during the mating process. Hinge assembly 27 extends generally parallel to the plane of cassette 11. A description of the components of hinge assembly 27 follows.

Extensions 29 project outwardly from the trailing edge of cassette 11, preferably at opposite sides of the trailing edge. Each extension 29 has a curved element 31 flanked by a pair of arms 33. Curved elements 31 have a first surface 67 shaped to engage a hinge pin on housing 13 and a second surface 69 opposite first surface 67 shaped to interact with a block 65 on housing 13.

Each outermost arm 33 includes an outwardly facing, or exterior surface 35 that interacts with corresponding surfaces on the hinge assembly of housing 13 to ensure proper lateral alignment of pins 3 on electrical component 1 and the contacts on housing 13 during mating.

Another extension 39 projects outwardly from the trailing edge of housing 13. Extension 39 preferably extends from a central location along the trailing edge of housing 13 between extensions 29, but extends in a direction opposite of extensions 29. Central extension 39 has a curved element 71 flanked by a pair of arms 73. Curved elements 71 have a first surface 75 shaped to engage a hinge pin on housing 13 and a second surface 77 opposite first surface 75 and shaped to interact with block 65 on housing 13.

FIGS. 3a and 3b display a portion of the lower surface of base plate 15. With this arrangement, pins 3 of electrical component 1 can freely project from apertures 17 and extend beyond the bottom surface of base plate 15. Base plate 15 provides lateral support to the portions of pins 3 residing within base plate 15. However, the distal ends of pins 3 (i.e. the portions of pins extending beyond the lower surface of base plate 15) are not laterally supported.

Figure 3C:
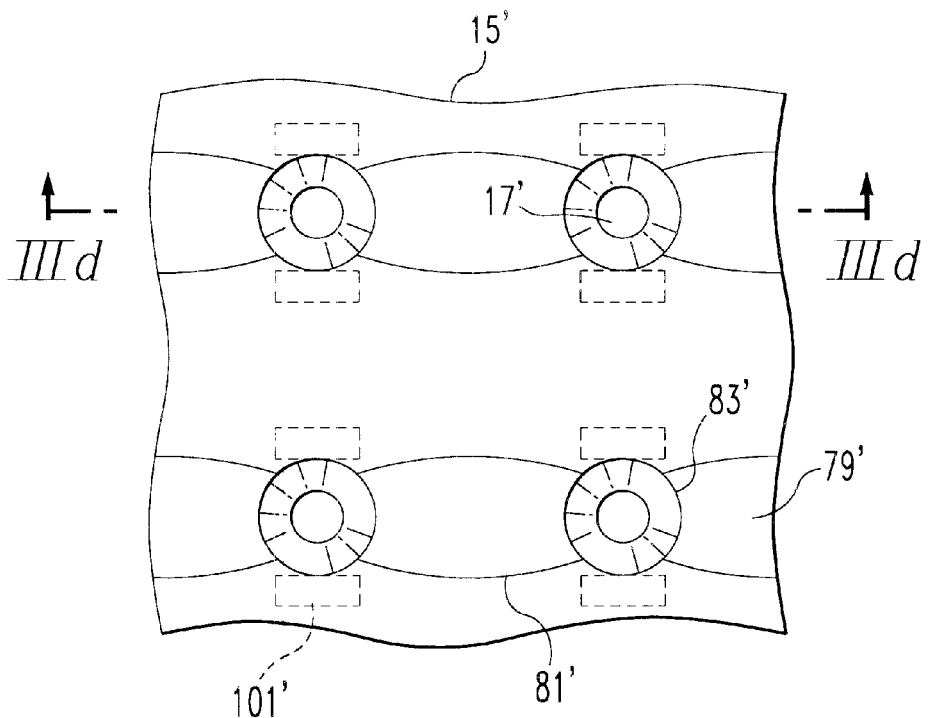
Figure 3D:
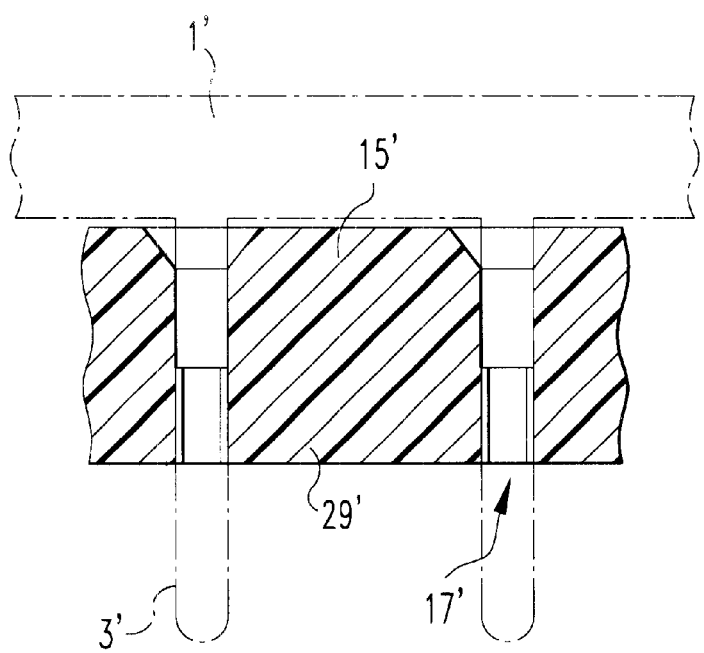
FIG. 3d is a cross-sectional view of the portion of the connector shown in FIG. 3c taken along line IIID—IIID.

FIGS. 3c and 3d demonstrate an alternative arrangement in which base plate 15' laterally supports a greater length of pins 3' than the earlier alternative embodiment. Specifically, FIGS. 3c and 3d demonstrate an alternative arrangement of the lower surface of base plate 15', which includes bridges 79' positioned between each aperture 17'. Bridge 79' may include arcuate sides 81' and recessed ends 83'.

Recessed ends 83' correspond to the shape of pins 3'. As seen in FIG. 3c, if electrical component 1 uses round pins 3', recessed ends 83' have a rounded, concave shape to receive a portion of pin 3'. Bridges 79' are located on base plate 15' so as not to interfere with contacts 100'. As shown in FIG. 3c, beams 101' of each contact 100' are arranged in a column, while bridges 79' are arranged in rows. Thus, the presence of bridges 79' do not affect the flexure of beams 101'. Bridges 79' may be molded unitarily with base plate 15'.

Figure 4B:
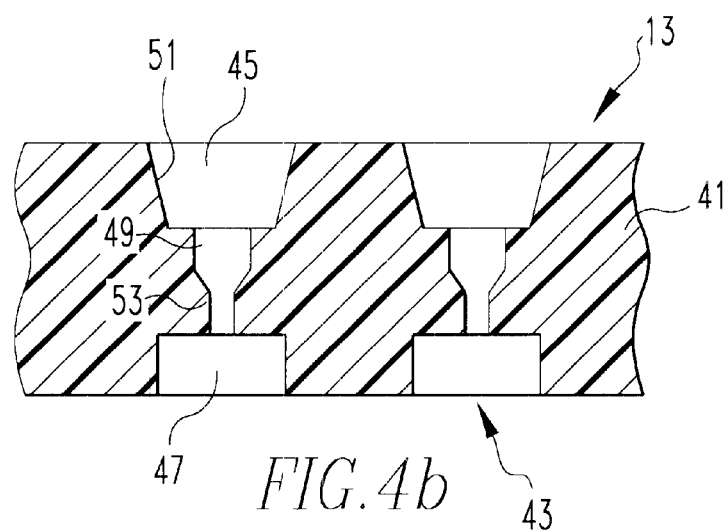
FIG. 4b is a cross-sectional view of the portion of the connector shown in FIG. 4a taken along lines IVB—IVB.
Figure 4C:
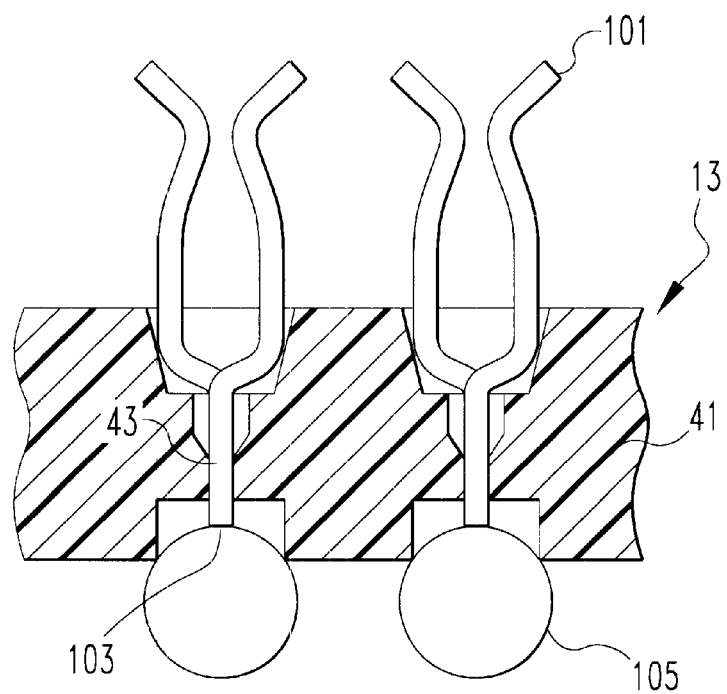
FIG. 4c is the cross-sectional view of the portion of the connector in FIG. 4b with contacts inserted therein.

FIGS. 4a–4c display housing 13, which is preferably manufactured from a suitable plastic. Housing 13 includes a base 41 with a plurality of apertures 43 extending therethrough. As with base 15, base 41 can have a generally planar configuration, although other orientations are possible.

Each aperture 43 preferably includes three portions. First portion 45 is a relatively wide opening so as to accommodate the flexure of dual beams 101 of contact 100 during mating. Second portion 47 accommodates tail portion 103 of contact 100 and, as described below, a portion of a fusible element 105. Finally, third portion 49 retains intermediate portion 107 of contact 100 within aperture 43.

As shown in FIG. 4b, beam accommodating portion 45 resides at the mating end of housing 13 and has tapered side walls 51 forming a lead-in. Tapered side walls 51 allow for the easy insertion of contact 100 within aperture 43 and allow the flexure of beams 101 by pins 3 without restriction.

Tail accommodating portion 47 resides at the mounting end of housing 13. Since housing 13 can surface mount to substrate S, preferably using Ball Grid Array (BGA) technology, tail accommodating portion 47 can have a suitable shape to accommodate the BGA features. In one example of BGA technology, a fusible element, such as a solder ball 105, secures to tail portion 103 of contact 100. At least a portion of solder ball 105 secured to tail portion 103 of contact 100 can seat within tail accommodating portion 47 of aperture 43. International Publication number WO 98/15989 (International Application number PCT/US97/18066), herein incorporated by reference, describes methods of securing a solder ball to a contact and of securing a solder ball to a substrate.

Intermediate portion 49 extends between beam accommodating portion 45 and tail accommodating portion 47. Opposed walls of intermediate portion 49 each include a protuberance 53 extending towards each other. As seen in FIG. 4b, protuberance 53 can be a rib extending axially along a length of aperture 43. The distance between opposed walls of intermediate portion 49 exceeds the width of contact 100 to allow contact 100 to pass through aperture 43. However, the width of contact 100 exceeds the distance between the opposed protuberances 53. As a result, contact 100 interference fits between protuberance 53 for retention in aperture 43.

Base plate 41 can also have a wall 55 along its outer perimeter. Similar to wall 19 of cassette 11, wall 55 extends from plate 41 and protects contacts 100 from damage. When cassette 11 and housing 13 mate, wall 19 of cassette 11 resides between wall 55 and contacts 100. As seen in FIG. 4a, the leading edge of wall 15 includes a notch 57 to receive tab 25 from cassette 11 when connector 10 is in a mated condition. This allows complete rotation of cassette 11 relative to housing 13 for mating all pins 3 and contacts 100. To avoid interference with hinge assemblies 27, 59, wall 55 is discontinuous in the trailing edge region of base 41.

The trailing edge of base plate 41 includes a hinge assembly 59 that interacts with hinge assembly 27 of cassette 11 to allow rotation of cassette 11 relative to housing 13. Hinge assembly 59 extends generally parallel to the plane of housing 13 and includes a hinge pin 61 braced by a series of supports 63 along the trailing edge of housing 13.

A series of cams, or blocks 65 extend from the trailing edge between adjacent supports 63. Blocks 65 have curved surfaces 75 that correspond to second surfaces 69, 77 of extensions 33 and central extension 35. Curved surfaces 75 of blocks 65 can be circular and preferably have substantially the same radius of curvature as second curved surfaces 69, 77 of extensions 33 and central extension 35. This can ensure proper longitudinal and Z-axis (i.e. normal to the plane of housing 13) alignment of pins 3 of electrical component 1 and contacts 100 in housing 13 for mating.

Each outermost support 63 includes an inwardly facing, or interior surface 85 that interact with surfaces 35 of hinge assembly 27 to ensure proper alignment of pins 3 of electrical component E and contacts 100 during mating. Specifically, surfaces 35 of cassette 11 abut surfaces 85 of housing 13 for precisely aligning cassette 11 and housing 13 laterally for mating pins 3 and contacts 100.

The mating of cassette 11 and housing 13 will now be described. Initially, cassette 11 and housing 13 are separate, or unmated. In this condition, housing 13 should be secured to substrate S. As discussed above, housing 13 can be surface mounted to substrate S, preferably using BGA technology. However, other methods could be used.

Next, electrical component 1 secures to cassette 11. In the embodiment described above, pins 3 of electrical component 1 enter apertures 17 until latch 21 retains electrical component 1 against cassette 11.

Figure 5:
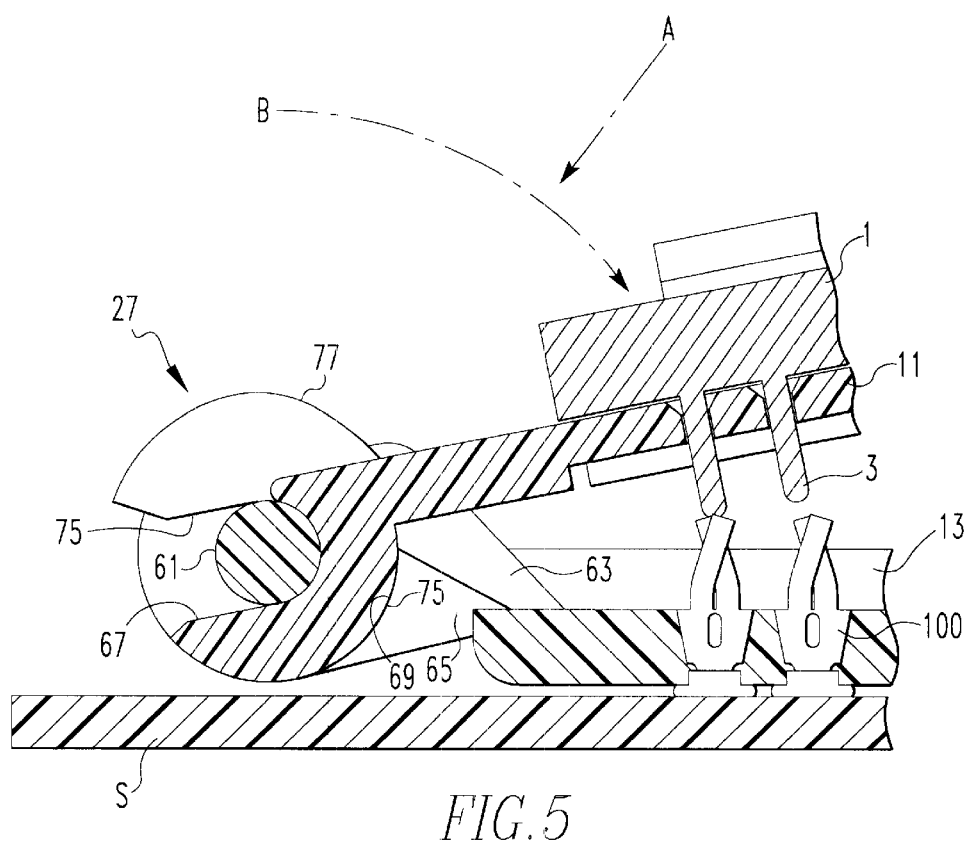
FIG. 5 is a cross-sectional view of a portion of the connector taken along lines V—V in FIG. 1b.

To interface cassette 11 and housing 13, hinge assemblies 27, 59 must mesh as shown in FIGS. 1b and 5. The features of hinge assemblies 27, 59, cassette 11 and housing 13 enhance the ease of blind mating cassette 11 and housing 13.

Describing the mating in particular, extensions 29 and central extension 39 enter the openings formed between hinge pin 61, supports 63 and the trailing edge of housing 13. Insertion occurs in the direction designated by arrow A in FIG. 5. Arms 33, 73 of hinge assembly 27 enter the areas flanking blocks 65 of hinge assembly 59. Outer surfaces 35 of arms 33 abut surfaces 85 of support 63. The interaction of outer surfaces 35 with inner surfaces 85 laterally align pins 3 and contacts 100 along an axis parallel to the trailing edges of cassette 11 and housing 13.

In the mated, open condition shown in FIG. 1b, surfaces 75 of blocks 65 begin to abut second surfaces 69, 77 of extensions 29 and central extension 39 as cassette 11 rotates along the direction of arrow B in FIG. 5. Surfaces 69, 75, 77 help align cassette 11 and receptacle 13 along an axis parallel to the sides of cassette 11 and housing 13. Preferably, the other adjacent surfaces of arms 33, supports 63 and blocks 65 have a clearance therebetween to reduce the amount of force required to rotate cassette 11.

Extensions 29 and central extension 39 provide a retaining force on opposite sides of hinge pin 61 as seen in FIG. 5 due to the opposite orientation of central element 39 relative to extensions 29. The retaining forces, along with the placing of extensions 29 and central extension 39 between hinge pin 61 and housing 13 prevents separation of cassette 11 from housing 13. In other words, cassette 11 can only separate from housing 13 by reversing the mating process (i.e. rotating cassette 11 away from housing 13).

Rotation of cassette 11 relative to housing 13 begins the mating of pins 3 of electrical component 1 and contacts 100 in housing 13. As seen in FIG. 5, the column of pins 3 and contacts 100 closest to the trailing edges of cassette 11 and housing 13 mate first. Mating progresses with each subsequent column away from the trailing edges of cassette 11 and housing 13. Sequential mating of pins 3 and contacts 100 reduces the peak insertion force when compared to ZIF sockets.

The column of pins 3 and contacts 100 closest to the trailing edges of cassette 11 and housing 13 mate first. Mating progresses with each subsequent column away from the trailing edges of cassette 11 and housing 13.

The rotation of cassette 11 begins the mating of pins 3 and contacts 100. Each pin 3 progressively enters the space between the opposite arms of the dual beam contacts during rotation. The dual beams retain pin 3. The area between the dual beams is oriented generally parallel to the mating axis of cassette 11 and housing 13.

FIG. 1a shows connector 10 in a fully mated and closed condition. While mated, wall 55 of housing 13 surrounds cassette 11 and tab 25 can enter recess 57 in the leading edge of housing 13.

Figure 6:
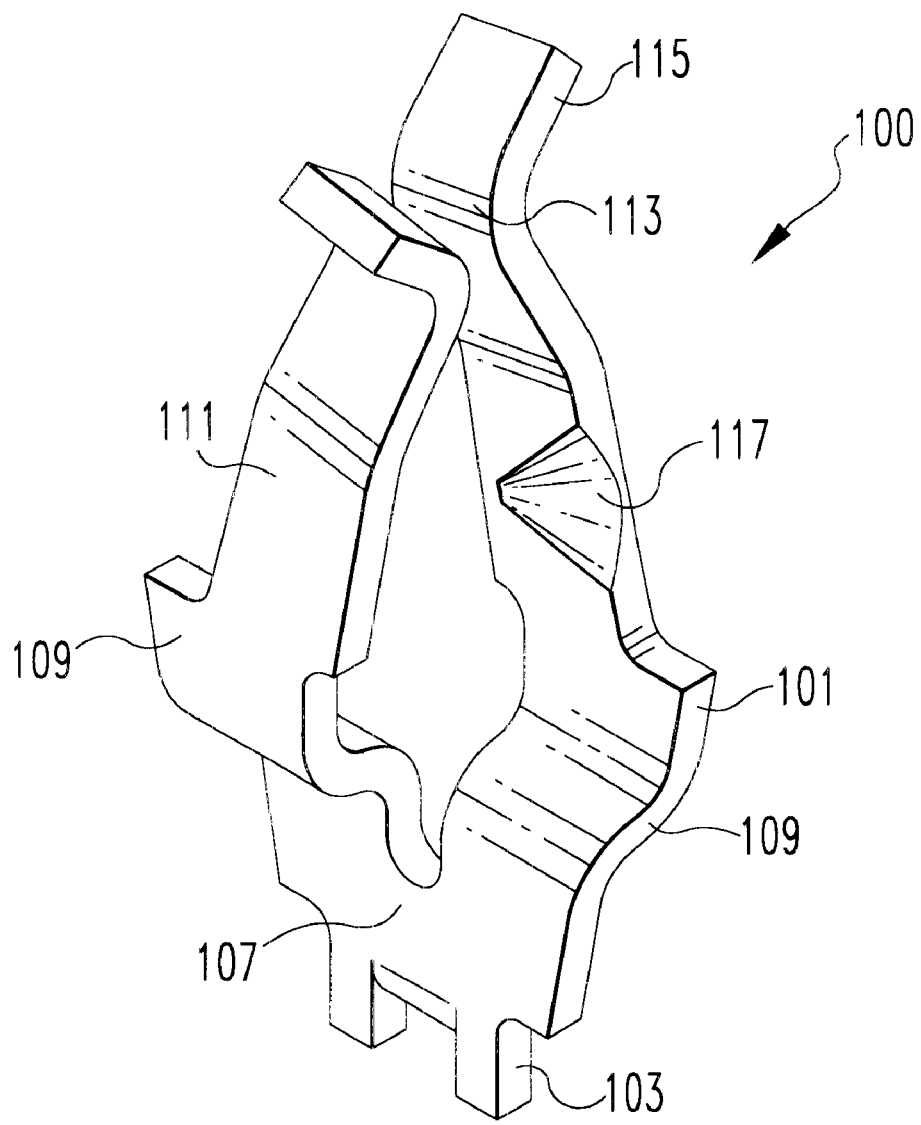
FIG. 6 is a perspective view of one alternative embodiment of a contact of the present invention.

Although connector 10 could utilize any type of contact, a detailed discussion of a preferred contact 100 follows. As seen in FIG. 6, contact 100 is an in-line dual beam contact. Contact 100 has an intermediate portion 107 located between a pair of beams 101 and a tail portion 103. Preferably, intermediate portion 107 is generally planar. Upon installation within housing 13, intermediate portion 107 contacts protuberances 53 and is interference fit within apertures 43 of base plate 41. This retention feature is also described in the aforementioned International Publication number WO 98/15989.

Figure 8:
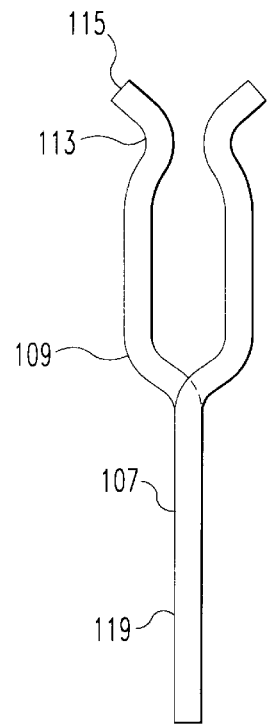
FIG. 8 is a side view of the contact shown in FIG. 6, but during assembly.

Each beam 101 includes a curved portion 109 extending from intermediate portion 107. As seen in FIG. 8, curved portions 109 remove beams 101 from the plane of intermediate portion 107. Each curved portion 109 resides on opposite sides of the plane of intermediate portion 107. This allows spatial separation between beams 101 to receive pin 3 therebetween.

An arm portion 111 extends from the distal end of curved portion 109. The distal ends of arm portions 111 include an inwardly curved portion 113 and a lead-in 115. As seen in FIGS. 6 and 8, inwardly curved portions 113 converge towards the plane of intermediate portion 107. The distance between opposed inwardly curved portions 113 (as seen in FIG. 8) is less than the thickness of pins 3. That is, pins 3 must separate beams 101 upon insertion. The resiliency of beams 101, when spread apart by pins 3, creates a good surface contact between contacts 100 and pins 3 and creates appropriate contact normal forces of beams 101 against the sides of pins 3.

Figure 9:
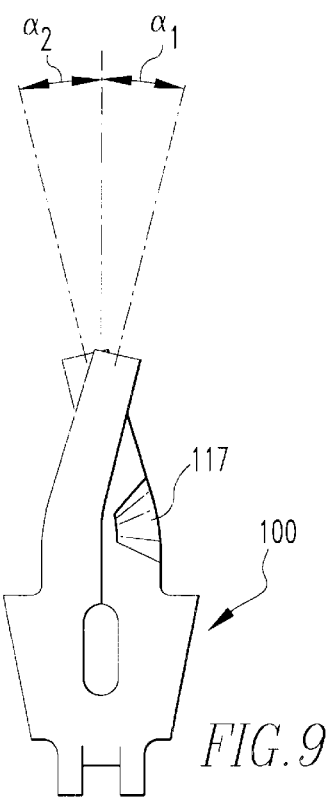
FIG. 9 is a front view of the contact shown in FIG. 6.

As seen in FIG. 9, each arm portion 111 is angled relative to the longitudinal axis of contact 100. The specific angle depends upon the size and shape of contact 100. The orientation of arm portions 111 preferably positions inwardly curved portions 113 in-line. That is, inwardly curved portions 113 create a pin receiving gap therebetween, whereby beams 101 engage opposing sides of pins 3 in an aligned condition. Stated differently, inwardly curved portions are located substantially along a longitudinal centerline of contact 100 as seen in FIG. 9.

Specifically, arm portions 111 extend at angles $\alpha_1$, $\alpha_2$, respectively, from the longitudinal axis of contact 100 of between approximately 5° and 20° for a typically sized contact. Most preferably, angles $\alpha_1$ and $\alpha_2$ are approximately 12.5° for a typically sized contact.

Although arms 111 are angled relative to the longitudinal axis, FIG. 8 demonstrates that arms 111 preferably remain substantially parallel to the plane of intermediate portion 107. Arms 111, however, could be angled from the plane of intermediate portion 107 up to approximately 10° (not shown).

Lead-in portions 115 extend from inwardly curved portions 113 in a direction away from the plane of intermediate portion 107. Lead-in portions 115 assist in aligning pins 3 with inwardly curved portions 113 during mating.

Figure 7:
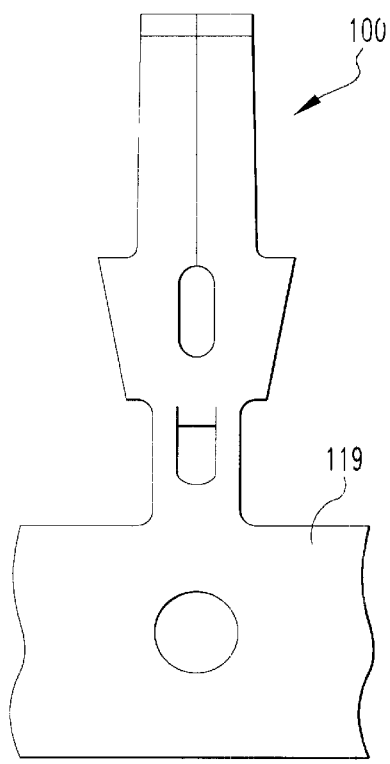
FIG. 7 is a front view of the contact of FIG. 6, but prior to assembly.

One method of making contact 100 will now be described. A sheet of material is stamped to form a carrier strip 119 of contacts 100 as seen in FIG. 7. The spacing between adjacent contacts 100 on carrier strip 119 equals the spacing of the contacts in housing 13. At this point, contact 100 is still in planar form.

A forming step then bends beams 101 out of the plane of intermediate portion 107, creates the inwardly curved portion 113 and creates the lead-in portion 115 as seen in FIG. 8. The forming steps are conventional and demand no further discussion.

The final step cants arms 111 relative to the longitudinal axis of contact 100 as seen in FIG. 9. Although many methods of canting arms 111 relative to the longitudinal axis may be utilized, the preferred method is any known coining process. The coining step forms a deformation zone 117 at the outside edge of the facing surfaces of opposed beams 101. Specifically, the coining process extrudes a portion of the material from zone 117. The amount of coining controls the relative canting of beams 101 to the longitudinal axis of contact 100. The canting step allows the formation of an in-line dual beam contact capable of achieving the reduced pitch requirements of the aforementioned technological advances.

Upon the canting of beams 101, contact 100 can be severed from carrier strip 119 for insertion into housing 13. The present invention allows contacts 100 to remain on carrier strip 119 further downstream in the connector forming process than with conventional techniques. By remaining on carrier strip 119 longer, the forming process of the present invention lends itself more readily to automated, or semi-automated, techniques.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A contact, comprising:
   a retention portion for engaging a connector housing, said retention portion having opposed ends and defining a plane;
   a tail portion extending from one of said opposed ends; and
   a pair of beams extending from the other of said opposed ends, each beam of said pair of beams comprising:
      a first portion displacing each of said beams from said plane of said retention portion while maintaining the longitudinal axes of each beam of said pair of beams parallel and wherein each of said beams of said pair of beams is located on an opposite side of said plane of said retention portion; and
      a second portion canted relative to said first portion, said second portion of each beam of said pair of beams including a contact interacting portion, wherein said contact interacting portions of said pair of beams interact to receive a contact therebetween.

2. The contact as recited in claim 1, wherein said second portion further comprises a deformed portion.

3. The contact as recited in claim 2, wherein said second portions each have a surface facing the other said second portion, said deformed portion located on said facing surfaces.

4. The contact as recited in claim 2, wherein said deformed portion is a reduced thickness portion.

5. The contact as recited in claim 4, wherein said reduced thickness portion is coined.

6. The contact as recited in claim 1, wherein the contact has a longitudinal axis; said first portions of said pair of beams are displaced on opposite sides of said longitudinal axis of said contact; and said second portions of said pair of beams are angled relative to said longitudinal axis of said contact.

7. The contact as recited in claim 6, wherein said contact interacting portions of said pair of beams generally intersect said longitudinal axis of said contact.

8. The contact as recited in claim 1, wherein said contact interacting portions of said beams each define a plane; said planes of said contact interacting portions angled between approximately 0° and 10° degrees relative to said plane of said retention portion.

9. The contact as recited in claim 8, wherein said planes of said contact interacting portions are substantially parallel with said plane of said retention portion.

10. A method of making a contact, comprising the steps of:
    providing a contact, said contact having:
       a retention portion for engaging a connector housing, said retention portion having opposed ends and defining a plane;
       a tail portion extending from one of said opposed ends; and
       a pair of beams extending from the other of said opposed ends;
    displacing a first portion of said beams from said plane of said retention portion so that said pair of beams are located on opposite sides of said plane of said retention portion yet still have parallel longitudinal axes; and
    canting a second portion of said beams relative to said first portion to provide a contact interacting portion adapted to receive a mating contact therebetween.

11. The method as recited in claim 10, wherein the providing step includes stamping said contact from a sheet of material.

12. The method as recited in claim 10, wherein the canting step comprises deforming said second portion to create a deformed portion.

13. The method as recited in claim 12, wherein said deformed portion on one beam faces said deformed portion on the other beam.

14. The method as recited in claim 12, wherein the deforming step includes forming a reduced thickness portion.

15. The method as recited in claim 14, wherein the deforming step comprises coining.

16. The method as recited in claim 10, wherein said contact has a longitudinal axis, the displacing step comprises placing said first portions on opposite sides of said longitudinal axis of said contact, and the canting step includes angling said second portions relative to said longitudinal axis of said contact.

17. The method as recited in claim 16, wherein the canting step includes intersecting said contact interacting portions with said longitudinal axis of said contact.

18. The method as recited in claim 10, wherein the canting step includes placing a plane of each said contact interacting portion at an angle of approximately 0° and 10° degrees relative to said plane of said retention portion.

19. The method as recited in claim 18, wherein said planes of said contact interacting portions are substantially parallel with said plane of said retention portion.

* * * * *